United States Patent
Trias

(10) Patent No.: US 11,125,789 B1
(45) Date of Patent: Sep. 21, 2021

(54) METHOD TO OBTAIN POWER FLOW SOLUTIONS IN RADIAL CHAIN-LIKE NETWORKS

(71) Applicant: Antonio Trias, Sant Cugat del Valles (ES)

(72) Inventor: Antonio Trias, Sant Cugat del Valles (ES)

( * ) Notice: Subject to any disclaimer, the term of this patent is extended or adjusted under 35 U.S.C. 154(b) by 513 days.

(21) Appl. No.: 15/958,390

(22) Filed: Apr. 20, 2018

Related U.S. Application Data

(60) Provisional application No. 62/488,810, filed on Apr. 23, 2017.

(51) Int. Cl.
| | |
|---|---|
| *G01R 19/25* | (2006.01) |
| *H02J 3/00* | (2006.01) |
| *G06Q 50/06* | (2012.01) |
| *G06F 17/11* | (2006.01) |

(52) U.S. Cl.
CPC .......... *G01R 19/2513* (2013.01); *G06F 17/11* (2013.01); *G06Q 50/06* (2013.01); *H02J 3/00* (2013.01); *H02J 2203/20* (2020.01)

(58) Field of Classification Search
CPC .... G01R 19/2513; H02J 3/00; H02J 2203/20; G06Q 50/06; G06F 17/11
See application file for complete search history.

(56) References Cited

U.S. PATENT DOCUMENTS

| | | | |
|---|---|---|---|
| 2006/0111860 A1* | 5/2006 | Trias ...................... | G01R 21/00 702/85 |
| 2011/0257933 A1* | 10/2011 | Trias ........................ | H02J 3/00 702/182 |
| 2017/0003330 A1* | 1/2017 | Trias ...................... | G06F 17/11 |

OTHER PUBLICATIONS

Rao , Exploration of a Scalable Holomorphic Embedding Method Formulation for Power System Analysis Applications (Year: 2017).*
Trias , The Holomorphic Embedding Load Flow Method, IEEE (Year: 2012).*

* cited by examiner

*Primary Examiner* — Mohammad K Islam

(57) ABSTRACT

A mathematical model of load flow equations for an electrical grid having a chain of busses is embedded in a holomorphic embedding using a first embedding parameter s. The holomorphic embedding is transcribed into software for use in a computer processor. Voltages for each bus are calculated as an algebraic curve parameterized by the first embedding parameter. A second embedding parameter z is defined wherein the first embedding parameter s is a function of the second embedding parameter z. The holomorphic embedding is re-parameterized using the second embedding parameter z, such that the re-parameterized embedding provides an elimination polynomial equation relating parameters s and z. The roots of the elimination polynomial equation are determined by solving the for zero, which roots are used to compute bus voltages for each bus of the chain of busses. The bus voltages are displayed as the solution to the load flow equations.

13 Claims, 3 Drawing Sheets

METHOD TO OBTAIN POWER FLOW SOLUTIONS IN RADIAL CHAIN-LIKE NETWORKS

CROSS REFERENCE TO RELATED APPLICATIONS

The present application claims the benefit of U.S. Patent Application Ser. No. 62/434,452 entitled "METHOD TO OBTAIN POWER FLOW SOLUTIONS IN RADIAL CHAIN-LIKE NETWORKS", filed on Apr. 23, 2017, the entire teachings of which are incorporated herein by reference.

BACKGROUND

Systems and methods herein relate to the general problem of calculating power flow studies of electrical networks, and more particularly to methods for calculating all possible solutions to the power flow equations, which find several practical applications in the assessment of voltage stability of power systems, as well as in optimization studies.

A power flow study consists in solving the so-called power flow (also "load flow") equations of electrical power transmission or distribution systems, in order to find the voltages that describe the steady state of the grid. This allows one to calculate all flows and most other magnitudes of interest for managing a power grid, both in planning and operating scenarios. Power flow calculations are also the cornerstone for many other types of analyses and applications in power systems. In particular, they play a major role in the assessment of voltage stability of power grids, since this type of stability is inherently linked to the problem of power flow feasibility, i.e. the existence of a valid solution to the power flow equations. The physics of electric power flow is such that there are always limits to the amount of power that can be transferred through a power network, regardless of other engineering constraints (such as maximum ratings in lines or transformers, due to overheating). Such limits depend on intrinsic characteristics of the system, namely the electrical admittances, and the operating voltages. As power demand is progressively increased in a given section of the network, while the corresponding amount of generation is provided, the voltages that section begin to decrease until the feasibility limit is met. The transition to infeasibility is marked by an abrupt drop in voltage, which is commonly referred to as voltage collapse. Terms, such as feasibility limit, voltage collapse, maximum transfer limit, maximum loadability point, or nose point (of P-V, Q-V curves) all refer to the same underlying phenomenon: a transition to the non-existence of an operating power flow solution in the equations. This problem has been approached from many different angles. The invention herein adopts methods from algebraic geometry, where such transitions are seen as branching points joining different solution branches of the algebraic problem.

Irrespective of the methods used to analyze voltage collapse points, it is important to be able to calculate all mathematical solutions to the power flow equations. It is well known that the power flow problem exhibits many mathematical solutions, but most of them do not correspond to the actual operating state of the network. Only one solution corresponds to the stable operating state; the rest correspond to lower-voltage, higher-loss states, which are normally prevented in well-operated power networks by means of adequate controls. Under low loading scenarios, such solutions do not play any role. However, as the system is progressively loaded and approaches one of its many possible voltage collapse points, such non-operational solutions start playing an important role: one or more of them will eventually collapse with the operating solution. Proximity of these solutions thus carries information about voltage stability, in terms of the distance to voltage collapse points.

Additionally, the study of multiple solutions of the power flow problem is also of interest in the area of Optimal Power Flow (OPF), where they have been shown to contain information about possible non-convexities in the power flow feasible space. This is important to predict and explain the behavior of convex relaxations of power system optimization problems.

Finally, the possibility that there may exist multiple stable power flow solutions in a real power network cannot be entirely ruled out. Many non-operational power flow solutions are physically feasible—their dynamic stability is a different question, but that depends on the multiple controls present in a network. Some authors have shown that it is indeed possible to have multi-stability, particularly in the presence of power flow reversal on certain distribution systems. From all of the above, being able to compute multiple solutions to the power flow equations is important and finds practical applications in several areas.

Broadly speaking, there exist two classes of methods for computing possible solutions to the power flow equations: (a) those that solve the problem as a system of polynomial equations, performing an elimination procedure that arrives at a single polynomial equation (of very high degree) in one variable; (b) those employing numerical homotopy methods. In the former case, the methods employ either the mathematical theory of resultants, or, more commonly, Buchberger's algorithm for finding a Grobner basis of the system. These methods are implemented using computer algebraic tools, which have the advantage that one may work with symbolic expressions instead of having to provide definite numerical values for all parameters. However, they also have a great disadvantage: the time complexity and memory requirements of these algorithms explode tremendously, so much so that it is impossible to solve general networks of more than about six buses even with computers using current technology.

On the other hand, homotopy methods employ numerical computation. Also called path-following methods, these methods numerically track solutions starting from a suitably defined easier system that is continuously deformed into the original system. Modern implementations, such as the Numerical Polynomial Homotopy Continuation Method (NPHC), are able to find all possible solutions to the system, at least theoretically, with a probability of one. The scalability is much better than methods based on Grobner basis, although one also begins to encounter performance problems for systems larger than about 14 buses. This is to be expected, since the total number of possible solutions of a power flow problem is of the order of $2^N$, where N is the number of non-swing buses. A more significant shortcoming of homotopy methods is that their efficiency depends on having a tight upper bound on the total number of solutions. A generic, a priori upper bound is provided by Bezout's theorem, but it is typically too large, thus producing unnecessary exploration of homotopy paths in the method. Obtaining a tighter upper bound for generic power flow problems is a difficult mathematical task. In addition to this, another disadvantage of homotopy methods stems from the fact that they are purely numerical in nature: they are unable to convey the same level of analytical insight as computer algebra methods, which can obtain an explicit symbolic expression for the elimination polynomial, whose roots provide all branches.

The new method herein improves upon the shortcomings of the methods mentioned above, for a special class of power networks: radial networks with a chain-like topology (where, in the case of direct current (DC), the endpoint may optionally have a "delta" or a "wye" bus configuration). The method adopts the algebraic-geometric viewpoint of the power flow problem, and more specifically the holomorphic embedding framework, which was the basis for the power flow method of U.S. Pat. Nos. 7,519,506 and 7,979,239 to Trias. This technique, from here onwards termed the Holomorphic Embedding Load-flow Method (HELM), is non-iterative, constructive, and takes advantage of the specific mathematical structure of the power flow problem. HELM is based on a holomorphic embedding of the equations that reveals their fundamental geometric structure: a plane algebraic curve. As HELM is primarily concerned with finding the operational solution, the method employs complex analysis techniques (power series and Padé approximants) in order to construct the numerical values of such solution. By contrast, the invention herein is aimed at finding all solutions.

SUMMARY

The present disclosure is framed under the general field of power flow studies (also known as load-flow studies) of power systems. The method disclosed herein comprises a procedure for calculating all possible mathematical solutions to the steady-state power flow equations for a special class of power systems: radial networks with a chain-like topology. The method applies equally to both AC and pure-DC power networks, using the appropriate recursive formulas that apply to each case as disclosed here. In the particular case of DC networks, the method can additionally contemplate chains where the end-point consists in a "delta" or "wye" bus configuration.

The power flow equations have many mathematical solutions: of the order of $2^N$, where N is the number of non-swing buses. Normally, only one among these describes the actual operating state of the power network, which is referred to as the operational solution. However, finding all possible solutions is also important. It has important applications in the assessment of voltage stability (and possible multi-stability) of power systems, as they reveal information about proximity and margins to voltage collapse. It is also of interest in the field of power system optimization (OPF).

The method herein improves upon existing ones by providing an extremely efficient procedure for obtaining an elimination polynomial corresponding to the original equations. The roots of this polynomial then yield all possible voltage solutions for the elimination variable, and the rest of the voltage variables are easily obtained by back substitution in the triangular elimination expressions. The actual calculation of numerical values is carried out by polynomial root-finding, for which there are several well-known efficient methods, even for polynomial degrees going up into a million. On the other hand, the method applies to both DC and AC networks. The only restriction to observe is that the network topology should be one of the aforementioned types.

Using the framework of the Holomorphic Embedding Loadflow Method (HELM), the method starts by embedding the system equations using a complex parameter s. As it is usually done in most embedding techniques, the equations at s=0 represent a system that is easy to solve, while the equations at s=1 represent the original system. However, in HELM the embedding is specifically designed to exploit the algebraic structure of the power flow problem. After suitable duplication of variables in order to eliminate complex conjugation and thus preserve holomorphicity, the HELM embedding turns the original system of polynomial equations into an algebraic curve. Moreover, the embedding is designed to explicitly expose the projective invariance of the problem with respect to a rescaling of voltages and power injections. This is done by scaling all shunts and power injections (both generation and loads) under a multiplicative embedding factor s, so that the system at s=0 becomes a pure transmission network with no injections, and only voltage reference sources (swing buses). In the context of HELM, which is mainly concerned with computing the operational solution, this is important because it singles out a reference solution branch at s=0 and allows univocal calculation of the operational solution. Here, however, the invention is focused on finding all solutions, and therefore it focuses on the study of the whole algebraic curve, i.e. all its branches.

The present method then takes advantage of the chain-like topology of the target network by considering a certain type of re-parameterization $s=s(z)$ of the algebraic curve. This change of parameters involves the voltage variable corresponding to the last bus in the chain, and its effect is such that it allows the progressive elimination of all other voltage variables, traversing up the chain until the swing bus is reached. At the end of the procedure, all voltage variables are eliminated in terms of the new parameter z, and one is left with a single polynomial equation relating parameters s and z. The procedure yields a recursive method for the actual construction of the polynomial, which is simple, extremely fast, and uses far less memory resources compared to competing techniques based on Grobner basis methods.

Once the elimination polynomial is obtained, its roots provide, for a given value of s, all possible branches of the algebraic curve. Therefore, for s=1 the roots provide all possible solutions of the power flow problem. Computing the roots of said polynomial is performed with standard numerical methods for polynomial root finding, which are widely available to any practitioner skilled in the art.

The method is exemplified on both DC and AC power networks. The disclosed embodiment for DC networks shows the key algebraic procedures. The AC case employs essentially the same procedures, but first the power flow equations need to be converted into a proper algebraic equation containing no complex conjugation operators. This is achieved by the standard mechanism whereby one doubles the system by considering the original equations and their complex conjugates, then converting all magnitudes $V_i^*$ into new formal variables $\hat{V}_i$. Once all solutions to this enlarged system are found, the power flow solutions are those for which one has $V_i^* = \hat{V}_i$.

DETAILED DESCRIPTION

The power flow equations that describe the steady-state of a basic power system, comprised of constant PQ power injections plus (optionally) constant current injection terms, are given by the current balance at each bus, as follows:

$$\sum_{j \neq i}^{N} Y_{ij}^{(tr)}(V_i - V_j) + Y_i^{(sh)} V_i = I_i + \frac{S_i^*}{V_i^*} \quad (1)$$

Figure 1:
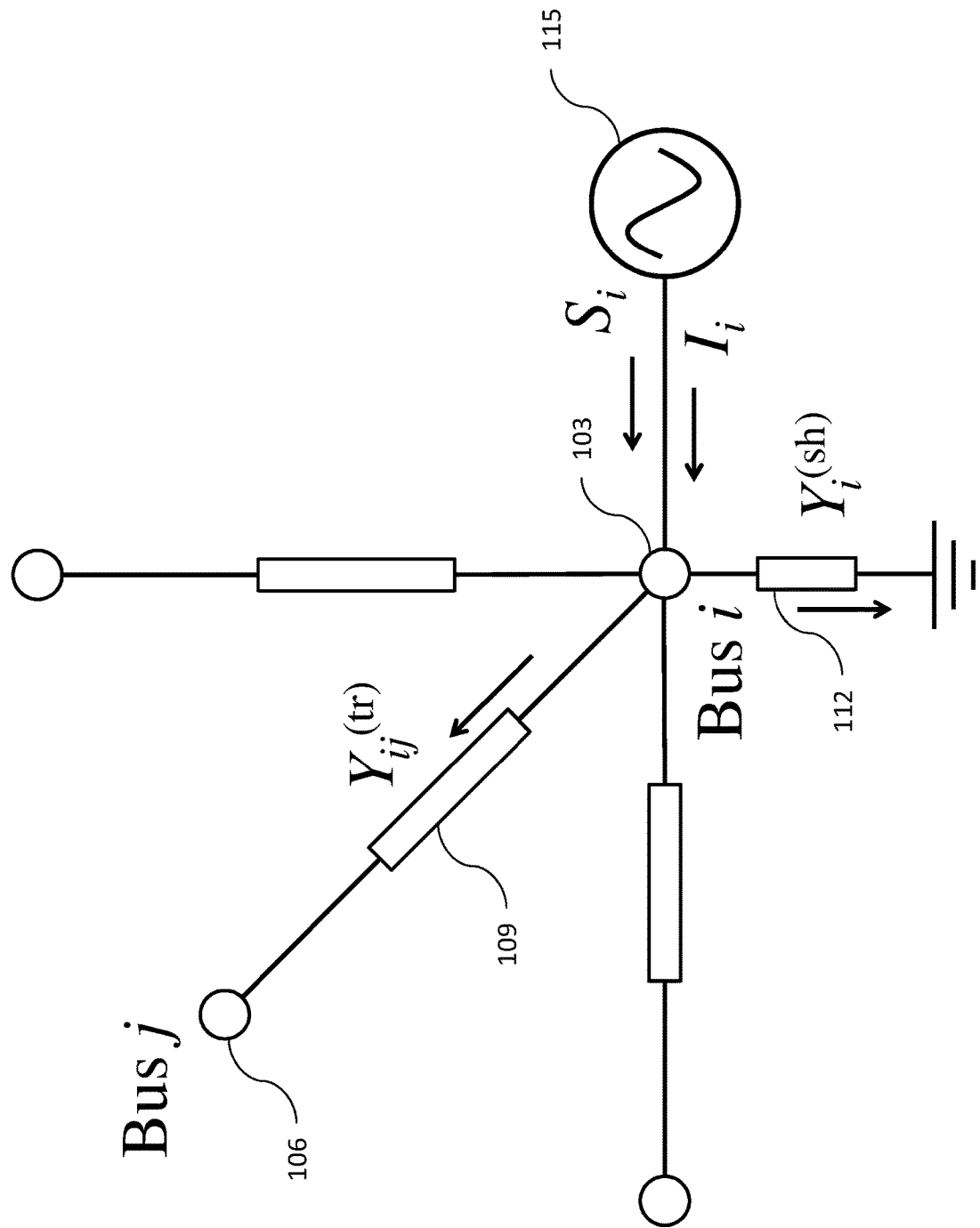
FIG. 1 is a schematic representation of a power network, displaying sign conventions for voltage and power flow magnitudes as they are used in the systems and methods herein.

FIG. 1 depicts the nomenclature and sign conventions used in the description of the systems and methods herein. This schematic drawing illustrates a generic bus in an AC electric power network. Equation 1) holds for the voltage $V_i$ at each bus i 103, and the summation on the right hand side runs over all neighbor buses j 106, which are linked by transmission lines 109 having admittances $y_{ij}^{(tr)}$. In the case of DC power networks, the admittances have only a real part, the conductance, which will be designated by the standard symbol $G_{ij}^{(tr)}$. The shunt 112, indicated by the term $Y_i^{(sh)}$ is meant to include both the line charging susceptance and any other constant-impedance modeling component of the load or any other device attached to the bus. In the DC case, these shunt admittances become shunt conductances $G_i^{(sh)}$. Each non-swing bus i 103 may also have constant current $I_i$ or constant power injections $S_i$ provided by a load or generator 115. The sign convention used here is the active sign convention, whereby generators inject positive power and loads inject negative power. In the DC case, complex power injections $S_i$ become real power injections $P_i$. Constant-current injections $I_i$ will be dropped from the mathematical treatment of the embodiments herein, because they can always be eliminated by linear transformations so that the resulting equations take on the same form, albeit with transformed parameters. Without loss of generality, a swing bus is assumed at index 0. In each equation, the sum goes over all bus indices, including the swing bus. There is one equation per non-swing bus, labeled by index i.

Figure 2:
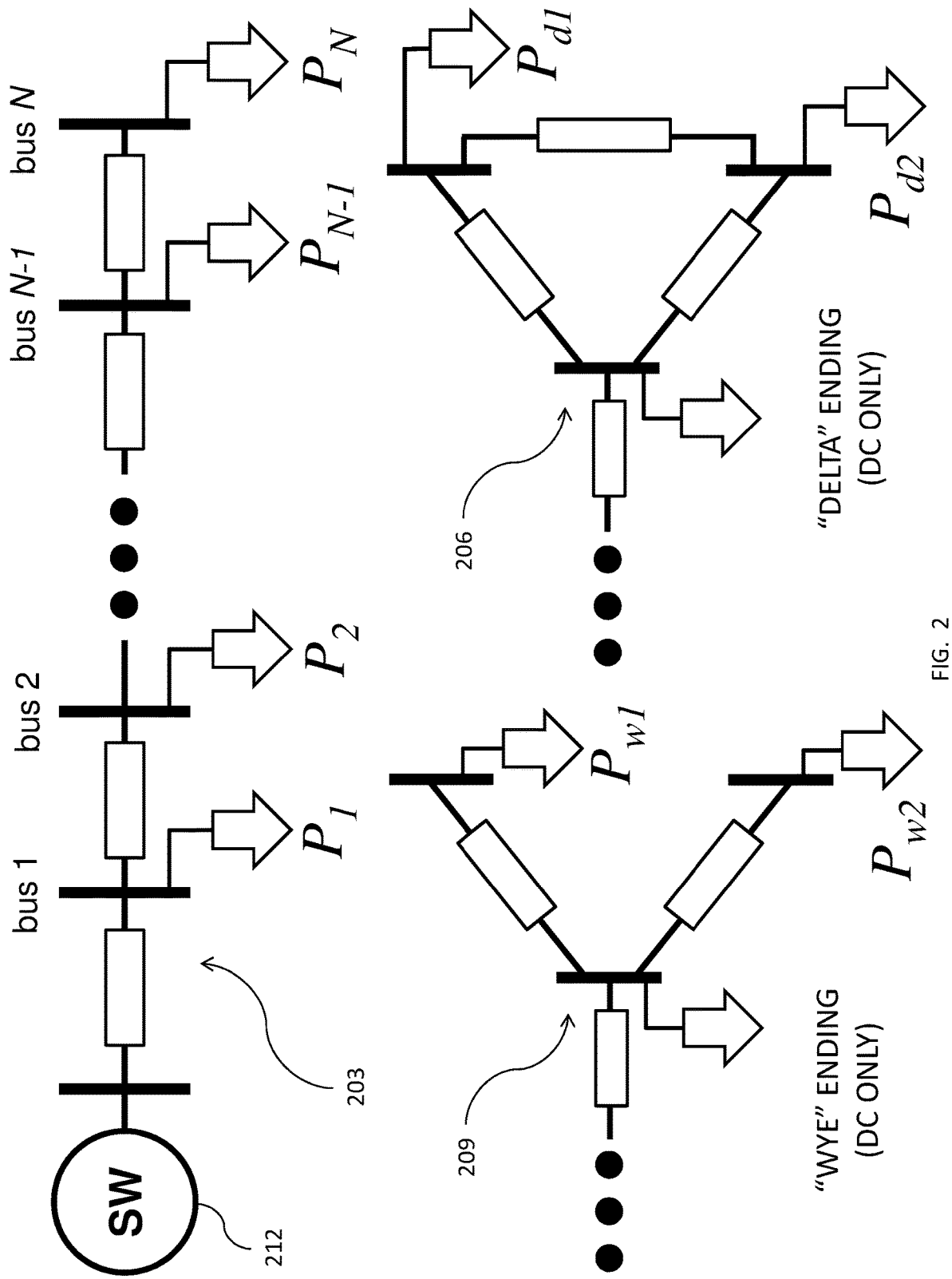
FIG. 2 is a diagram illustrating the types of power network topologies to which the methods herein can be applied: radial, chain-like (optionally with a "delta" or "wye" bus topology at the end of the chain, in the DC case).

FIG. 2 schematically shows the classes of power networks to which the methods herein apply. The main class is a radial network with a chain-like topology 203. In the DC case, there are also two variants: a chain ending in a "delta" bus topology 206, and a chain ending in a "wye" bus topology 209. A swing bus 212 is assumed to be located at the beginning of the chain in all cases.

The first embodiment herein exemplifies the method as applied to the simplest non-trivial case, a pure-DC power network consisting of three buses in a chain-like topology. The swing bus is chosen at one extreme of the chain (bus index i=0), and the rest of the buses are indexed sequentially along the chain. The holomorphically embedded power flow equations for this system are:

$$(V_1 - V_{sw})G_{01} + (V_1 - V_2)G_{12} = \frac{sP_1}{V_1} \quad (2)$$

$$(V_2 - V_1)G_{12} = \frac{sP_2}{V_2}$$

Here the sign convention is the active one: positive $P_i$ will denote actual power generation, while negative values denote power consumption (loads). The system is now expressed in terms of dimensionless quantities. This is achieved by dividing both equations by $V_{sw}$ and each equation i by $G_{i-1,i}$, and then defining the following dimensionless variables and parameters:

$$U_i \equiv \frac{V_i}{V_{sw}}; \sigma_i \equiv \frac{P_i}{G_{i-1,i}V_{sw}^2}; r_i \equiv \frac{G_{i,i+1}}{G_{i-1,i}} \quad (3)$$

With these definitions one arrives to the system:

$$(1 + r_1)U_1 - r_1 U_2 - 1 = \frac{s\sigma_1}{U_1} \quad (4)$$

$$U_2 - U_1 = \frac{s\sigma_2}{U_2}$$

This is a system of polynomial equations (their polynomial form can be made explicit by multiplying each equation i by the denominator $U_i$), which defines each voltage $U_i(s)$ as an algebraic curve parameterized by the embedding parameter s. The next step consists in a re-parameterization of this system, defining a new complex parameter as $s=zU_2^2(s)$. This has the virtue of allowing the elimination of the voltage variable corresponding to the bus sitting next to bus 2, simply using the second equation in the system:

$$U_1 = \frac{U_2^2 - s\sigma_2}{U_2} = \frac{U_2^2 - zU_2^2\sigma_2}{U_2} = (1 - z\sigma_2)U_2 \quad (5)$$

So that $U_1$ can now be substituted into the first equation and one arrives at the following simple solution for $U_2$ as a function of the new parameter z:

$$U_2 = \frac{1 - z\sigma_2}{1 - (\sigma_1 + \sigma_2(2 + r_1))z + (1 + r_1)\sigma_2^2 z^2} \quad (6)$$

In this equation there is only one value of $U_2(z)$ for a given value of the new parameter z. The multiple solution branches of the original problem are actually obtained from the definition of the new parameter z, which links the values of the two parameters:

$$s = \frac{z(1 - z\sigma_2)^2}{[1 - (\sigma_1 + \sigma_2(2 + r_1))z + (1 + r_1)\sigma_2^2 z^2]^2} \quad (7)$$

This equation may be considered as the actual elimination polynomial. It is a polynomial equation of fourth degree, so that it has in general four roots, thus yielding four branches. For a given value of the parameter s (in particular, for s=1, which recovers the original power flow problem), each root z determines univocally a different voltage solution, as given by the elimination procedure, equations 6) and 5). This purely algebraic procedure guarantees that these are all the possible solutions to the system. Note that, in general, two or more roots may appear as complex conjugate pairs. Since we are considering DC networks, the corresponding conjugate pair solutions are not physical.

A more general embodiment follows here, which applies to a pure-DC, chain-like network composed of an arbitrary number N of non-swing buses. Let us consider the power flow equations of a radial chain composed of N+1 buses, again in dimensionless variables as in the previous embodiment, equation 3). The non-swing buses have been indexed from 1 (next to the swing at index 0) to N (at the end of the chain). The equations of the system are:

$$-1 + (1+r_1)U_1 - r_1 U_2 = \frac{s\sigma_1}{U_1} \quad (8)$$

$$-U_1 + (1-r_2)U_2 - r_2 U_3 = \frac{s\sigma_2}{U_2}$$

$$\vdots$$

$$-U_{N-2} + (1+r_{N-1})U_{N-1} - r_{N-1} U_N = \frac{s\sigma_{N-1}}{U_{N-1}}$$

$$-U_{N-1} + U_N = \frac{s\sigma_N}{U_N}$$

The voltage $U_N$ at the end bus is now used to define the re-parameterization $s=zU_N^2$. From the last equation, one readily eliminates $U_{N-1}$. It is useful to write the expression as follows:

$$\frac{U_{N-1}}{U_N} = 1 - \sigma_N z \quad (9)$$

Going sequentially back along the chain, the next equation can now be written in a similar way, after eliminating $U_{N-1}$ and rearranging terms:

$$\frac{U_{N-2}}{U_N} = \frac{1 - (\sigma_{N-1} + (2+r_{N-1})\sigma_N)z + (1+r_{N-1})\sigma_N^2 z^2}{1 - \sigma_N z} \quad (10)$$

Next, a recursive procedure is devised in order to continue eliminating all variables $U_{N-3}$, $U_{N-4}$ ..., etc., up to $U_1$. Let us introduce the following notation:

$$\frac{A_{N-k}(z)}{B_{N-k}(z)} \equiv \frac{U_k}{U_N} \quad k = N-1, \ldots, 1 \quad (11)$$

Here $A_i$ and $B_i$ are polynomials in z. For them to be uniquely determined, the denominators are now required to satisfy a normalization condition, $B_i(0)=1$. It is then straightforward to see that equation 9) provides $A_1(z)$ and $B_1(z)$, while equation 10) provides $A_2(z)$ and $B_2(z)$.

Next, let us consider the equation for a general bus index k, and replace the original parameter s by the defined re-parameterization in z:

$$-U_{k-1} + (1+r_k)U_k - r_k U_{k+1} = \frac{z\sigma_k U_N^2}{U_k} \quad (12)$$

This general equation can be made valid for all indices k=1, ..., N, by defining the special cases $U_0 \equiv 1$ and $r_N \equiv 0$. Dividing both sides by $U_N$, and using the definitions given by equation 11), it is straightforward to obtain the following recurrence relation:

$$\frac{A_{N-k+1}(z)}{B_{N-k+1}(z)} = (1+r_k)\frac{A_{N-k}(z)}{B_{N-k}(z)} - r_k \frac{A_{N-k-1}(z)}{B_{N-k-1}(z)} - z\sigma_k \frac{B_{N-k}(z)}{A_{N-k}(z)} \quad (13)$$

In this equation, the indices run from k=N, N-1, ... up to 1. If desired, the recurrence relation can be written equivalently by relabeling indices using n≡N-k, so that as the elimination proceeds in k from N to 1, index n goes from 0 to N-1:

$$\frac{A_{n+1}(z)}{B_{n+1}(z)} = (1+r_{N-n})\frac{A_n(z)}{B_n(z)} - r_{N-n}\frac{A_{n-1}(z)}{B_{n-1}(z)} - z\sigma_{N-n}\frac{B_n(z)}{A_n(z)} \quad (14)$$

Using the initial values $A_{-1}(z)=0$, $B_{-1}(z)=1$, $A_0(z)=1$, $B_0(z)=1$, this recursive relation provides all the required expressions, as it can be verified using equations 9) and 10) above. Therefore, this relation is used to progressively obtain all quotients $A_n/B_n$ up to the last one, for which n=N-1 (or, equivalently, k=1). This yields:

$$U_N(z) = \frac{B_N(z)}{A_N(z)} \quad (15)$$

And therefore, the equation relating parameters s and z is:

$$s = z\frac{B_N^2(z)}{A_N^2(z)} \quad (16)$$

This is the polynomial equation that provides all solutions to the system. Optionally, the recursive relation can be rewritten in the following simplified form, which can be verified to be equivalent to the former one by any person having ordinary skill in the art:

$$A_{n+1}(z)=(1+r_{N-n})A_n^2(z)-r_{N-n}A_{n-1}^2(z)A_n(z)-z\sigma_{N-n}B_n^2(z)$$

$$B_{n+1}(z)=A_n(z)B_n(z) \quad (17)$$

Written in this form, it is also easier to verify that the polynomial degrees of $A_n(z)$ and $B_n(z)$ are $2^{n-1}$ and $2^{n-1}-1$, respectively. Therefore, the polynomial equation 16) has degree $2^N$, so that the algebraic curve has $2^N$ branches (the $2^N$ roots, parameterized in s). Note also that, since the voltages are now expressed as quotients of polynomials in z, this procedure has achieved a rational parameterization of the algebraic curve. Based on well-known results from algebraic geometry, this demonstrates that the genus of the Riemann surface associated to the algebraic curve has genus 0, which explains why this method cannot be extended to networks of arbitrary topological structure: there are networks for which the corresponding algebraic curve can be proven to have genus 1 and higher, and therefore do not admit a rational parameterization.

The method concludes by using a numerical method for finding all $2^N$ roots z to the polynomial equation resulting from making s=1, in equation 16). For this, one may use any of several well-established and efficient methods for solving all roots of high-degree polynomials, which are widely available to practitioners of the art. For each root z, one obtains a corresponding solution by calculating the voltages from the elimination expressions in equations 15) and 11).

For the mathematical solution to be an actual power flow solution of the DC network, the roots have to be real-valued.

A third embodiment is disclosed now, which applies to an AC, chain-like network composed of an arbitrary number of buses. The non-swing buses are indexed from one (next to the swing at index 0) to N (at the end of the chain). As in the previous embodiment for DC systems, the method starts by rewriting the power flow equations in terms of dimensionless quantities. All equations are first divided by the swing voltage $V_{sw}$ (which, without loss of generality, will be assumed to be real; i.e., angle 0), and each equation i is divided by $Y_{i-1,i}$. Then the following dimensionless variables and parameters are defined:

$$U_i \equiv \frac{V_i}{V_{sw}}; \sigma_i \equiv \frac{S_i^*}{Y_{i-1,i}V_{sw}^2}; r_i \equiv \frac{Y_{i,i+1}}{Y_{i-1,i}} \qquad (18)$$

So that the holomorphically embedded equations are then written as follows:

$$-1 + (1+r_1)U_1(s) - r_1 U_2(s) = \frac{s\sigma_1}{U_1^*(s^*)} \qquad (19)$$

$$-U_1(s) + (1+r_2)U_2(s) - r_2 U_3(s) = \frac{s\sigma_2}{U_2^*(s^*)}$$

$$\vdots$$

$$-U_{N-2}(s) + (1+r_{N-1})U_{N-1}(s) - r_{N-1}U_N(s) = \frac{s\sigma_{N-1}}{U_{N-1}^*(s^*)}$$

$$-U_{N-1}(s) + U_N(s) = \frac{s\sigma_N}{U_N^*(s^*)}$$

The system is now converted into a proper system of algebraic equations by eliminating the complex conjugation operators. One standard way to do this consists in duplicating the system by adding the complex conjugate of each equation, while considering $U_i^*(s^*)$ to be new formal variables $\hat{U}_i(s)$, independent from $U_i(s)$. The enlarged system thus becomes:

$$-1 + (1+r_1)U_1(s) - r_1 U_2(s) = \frac{s\sigma_1}{\hat{U}_1(s)} \qquad (20)$$

$$-U_1(s) + (1+r_2)U_2(s) - r_2 U_3(s) = \frac{s\sigma_2}{\hat{U}_2(s)}$$

$$\vdots$$

$$-U_{N-2}(s) + (1+r_{N-1})U_{N-1}(s) - r_{N-1}U_N(s) = \frac{s\sigma_{N-1}}{\hat{U}_{N-1}(s)}$$

$$-U_{N-1}(s) + U_N(s) = \frac{s\sigma_N}{\hat{U}_N(s)};$$

$$-1 + (1+r_1^*)\hat{U}_1(s) - r_1^* \hat{U}_2(s) = \frac{s\sigma_1^*}{U_1(s)}$$

$$-\hat{U}_1(s) + (1+r_2^*)\hat{U}_2(s) - r_2^* \hat{U}_3(s) = \frac{s\sigma_2^*}{U_2(s)}$$

$$\vdots$$

$$-\hat{U}_{N-2}(s) + (1+r_{N-1}^*)\hat{U}_{N-1}(s) - r_{N-1}^*\hat{U}_N(s) = \frac{s\sigma_{N-1}^*}{U_{N-1}(s)}$$

$$-\hat{U}_{N-1}(s) + \hat{U}_N(s) = \frac{s\sigma_N^*}{U_N(s)}$$

As in the DC case, not all solutions to this system of algebraic equations are solutions to the power flow problem.

The physical solutions in this case are those for which the equation $\hat{U}_i(s)=U_i^*(s^*)$ holds for real values of the parameter s.

The procedure is now quite analogous to the DC case, only taking into account these new equations and their corresponding new variables. The re-parameterization is now defined using also the voltage variables at the end bus, only this time it needs to have certain symmetry:

$$s = z U_N(z) \hat{U}_N(z) \qquad (21)$$

This definition allows one to progressively eliminate the voltage variables for buses N-1, N-2, etc., all in terms of the voltage two variables of bus N. For instance, from the last equation in each set, one readily eliminates $U_{N-1}$ and $\hat{U}_{N-1}$. It is useful to write these elimination expressions as follows:

$$\frac{U_{N-1}}{U_N} = 1 - \sigma_N z; \frac{\hat{U}_{N-1}}{\hat{U}_N} = 1 - \sigma_N^* z \qquad (22)$$

The next elimination expressions can now be written in a similar way, after eliminating $U_{N-1}$ and $\hat{U}_{N-1}$ and rearranging terms:

$$\frac{U_{N-2}}{U_N} = \frac{1 - (\sigma_{N-1} + \sigma_N^* + (1+r_{N-1})\sigma_N)z + (1+r_{N-1})\sigma_N \sigma_N^* z^2}{1 - \sigma_N^* z} \qquad (23)$$

$$\frac{\hat{U}_{N-2}}{\hat{U}_N} = \frac{1 - (\sigma_{N-1}^* + \sigma_N + (1+r_{N-1}^*)\sigma_N^*)z + (1+r_{N-1}^*)\sigma_N \sigma_N^* z^2}{1 - \sigma_N z}$$

Next, a recursive procedure is devised in order to continue eliminating all variables for buses N-3, N-4, . . . , etc., up to those of bus 1. Let us introduce the following notation:

$$\frac{A_{N-k}(z)}{B_{N-k}(z)} \equiv \frac{U_k}{U_N}; \frac{\hat{A}_{N-k}(z)}{\hat{B}_{N-k}(z)} \equiv \frac{\hat{U}_k}{\hat{U}_N}; k = N-1, \ldots, 1 \qquad (24)$$

Here $A_i$, $B_i$, $\hat{A}_i$, and $\hat{B}_i$ are polynomials in z. For them to be uniquely determined, the denominators are now required to satisfy a normalization condition, $B_i(0)=1$, $\hat{B}_i(0)=1$. It is then straightforward to see, for instance, that the first elimination step performed above provides polynomials $A_1$, $B_1$, $\hat{A}_1$, and $\hat{B}_1$, while the second one provides polynomials $A_2$, $B_2$, $\hat{A}_2$, and $\hat{B}_2$.

Next, let us consider the equation for a general bus index k, and replace the original parameter s by the defined re-parameterization in z:

$$-U_{k-1} + (1+r_k)U_k - r_k U_{k+1} = \frac{z\sigma_k U_N \hat{U}_N}{\hat{U}_k} \qquad (25)$$

$$-\hat{U}_{k-1} + (1+r_k^*)\hat{U}_k - r_k^*\hat{U}_{k+1} = \frac{z\sigma_k^* U_N \hat{U}_N}{U_k}$$

This general equation can be made valid for all indices k=1, . . . , N, by defining the special cases $U_0 \equiv 1$, $\hat{U}_0 \equiv 1$, and $r_N \equiv 0$. Dividing both equations respectively by $U_0$ and $\hat{U}_0$, and using the definitions given above, it is straightforward to obtain the following recurrence relations:

$$\frac{A_{n+1}(z)}{B_{n+1}(z)} = (1 + r_{N-n})\frac{A_n(z)}{B_n(z)} - r_{N-n}\frac{A_{n-1}(z)}{B_{n-1}(z)} - z\sigma_{N-n}\frac{\hat{B}_N(z)}{\hat{A}_N(z)} \quad (26)$$

$$\frac{\hat{A}_{n+1}(z)}{\hat{B}_{n+1}(z)} = (1 + r^*_{N-n})\frac{\hat{A}_n(z)}{\hat{B}_n(z)} - r^*_{N-n}\frac{\hat{A}_{n-1}(z)}{\hat{B}_{n-1}(z)} - z\sigma^*_{N-n}\frac{B_n(z)}{A_n(z)}$$

In this equation, the indices have been relabeled using nN−k, so that, as the elimination proceeds in k from N to 1, index n goes from 0 to N−1. Using initial values $A_{-1}(z)=0$, $B_{-1}(z)=1$, $A_0(z)=1$, $B_0(z)=1$ in the first case, and $\hat{A}_{-1}(z)=0$, $\hat{B}_{-1}(z)=1$, $\hat{A}_0(z)=1$, $\hat{B}_0(z)=1$ in the second, these recursive relations provide all the required expressions, as it can be verified using the first and second elimination steps that were given above as an example. Therefore, these relations are used to progressively obtain all quotients $A_n/B_n$, $\hat{A}_n/\hat{B}_n$ up to the last one, for which n=N−1 (or, equivalently, k=1). This yields:

$$U_N(z) = \frac{B_N(z)}{A_N(z)}; \hat{U}_N(z) = \frac{\hat{B}_N(z)}{\hat{A}_N(z)} \quad (27)$$

And therefore, the equation relating parameters s and z is:

$$s = z\frac{B_N(z)\hat{B}_N(z)}{A_N(z)\hat{A}_N(z)} \quad (28)$$

This is the polynomial equation that provides all solutions to the system. Optionally, the recursive relations given by equation (26) can be rewritten in the following simplified form, which can be verified to be equivalent to the former ones by any person having ordinary skill in the art:

$$A_{n+1}=(1+r_{N-n})A_n\hat{A}_n - r_{N-n}A_{n-1}\hat{A}_{n-1}\hat{A}_n - z\sigma_{N-n}B_n\hat{B}_n$$

$$B_{n+1}=\hat{A}_n B_n \quad (29)$$

Written in this form, it is also easier to verify that the polynomial degrees of $A_n(z)$, $B_n(z)$, as well as those of their counterparts $\hat{A}_n(z)$, $\hat{B}_n(z)$, are $2^{n-1}$ and $2^{n-1}-1$, respectively. Therefore, the polynomial equation 28) has degree $2^N$, so that the algebraic curve has $2^N$ branches (the $2^N$ roots, parameterized in s).

The method concludes by using a numerical method for finding all $2^N$ roots z to the polynomial equation resulting from making s=1 in equation 28). For this, one may use any of several well-established and efficient methods for solving all roots of high-degree polynomials, which are widely available to practitioners of the art. For each root z, one obtains a corresponding solution by calculating the voltages from the elimination expressions. Finally, for a given root to provide a physical power flow solution of the original AC network, the new formal variables coming from the duplication procedure have to satisfy the relationships $\hat{U}_i(1)=U_i^*(1)$ at s=1.

An analogous embodiment can be devised for the two special cases in which a DC chain network is ended with either a "delta" or a "wye" bus topology, as depicted schematically in FIG. 2. In this case, the re-parameterization involves symmetric cross products of the voltages corresponding to the two end buses. Following procedures completely analogous to the ones disclosed in the above embodiments, which are straightforward to obtain for any person having ordinary skill in the art, one obtains the desired elimination polynomials, whose roots provide all solutions to the respective power flow problems.

Figure 3:
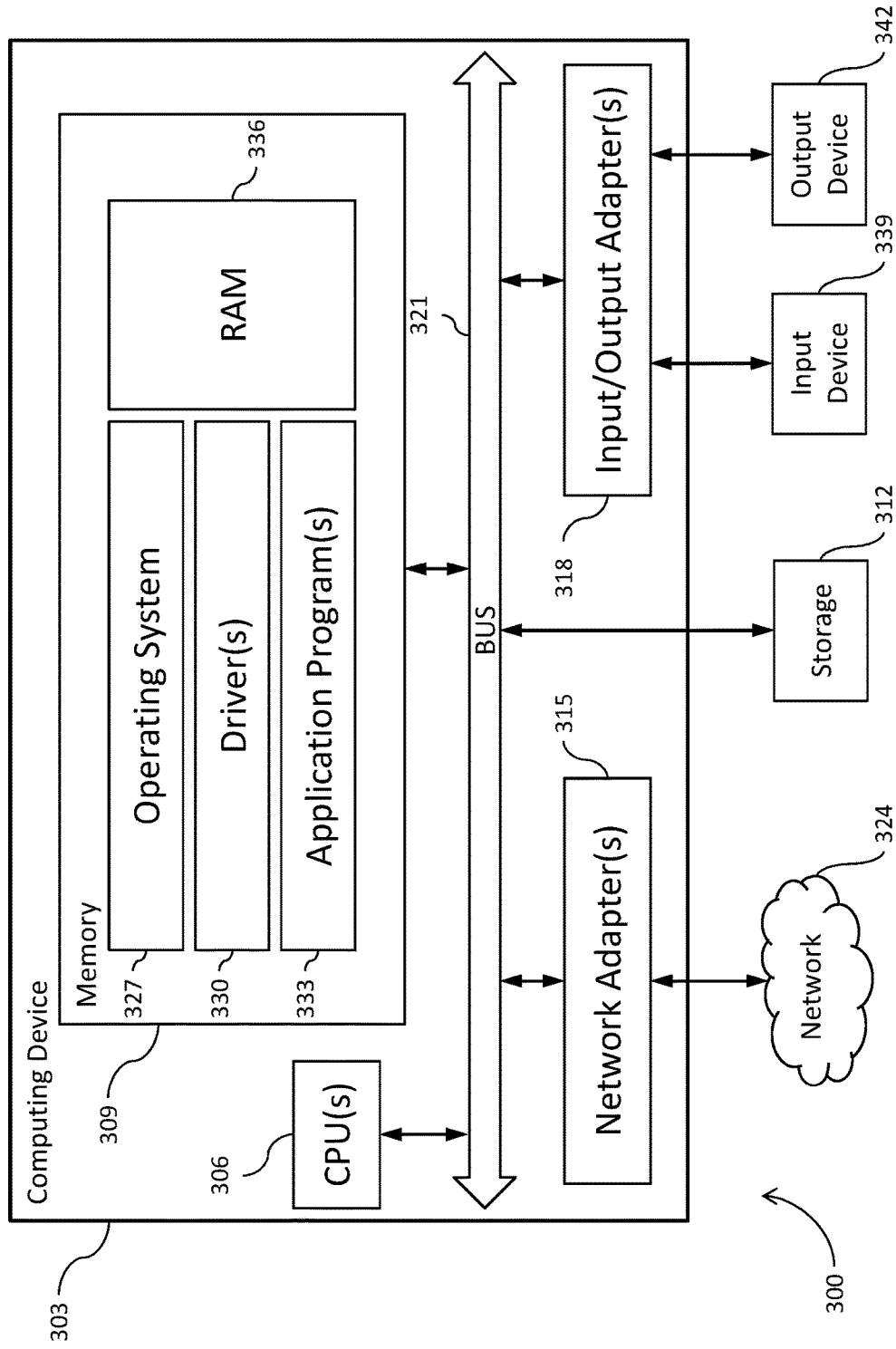
FIG. 3 is a schematic diagram of a hardware system according to systems and methods herein.

A representative hardware environment for practicing the systems and methods described herein is depicted in FIG. 3. This schematic drawing illustrates a hardware configuration of an information handling/computing system 300 in accordance with systems and methods herein. The computing system 300 comprises a computing device 303 having at least one processor or central processing unit (CPU) 306, internal memory 309, storage 312, one or more network adapters 315, and one or more input/output adapters 318. A system bus 321 connects the CPU 306 to various devices such as the internal memory 309, which may comprise random access memory (RAM) and/or read-only memory (ROM), the storage 312, which may comprise magnetic disk drives, optical disk drives, a tape drive, etc., the one or more network adapters 315, and the one or more input/output adapters 318. Various structures and/or buffers (not shown) may reside in the internal memory 309 or may be located in a storage unit separate from the internal memory 309.

The one or more network adapters 315 may include a network interface card such as a LAN card, a modem, or the like to connect the system bus 321 to a network 324, such as the Internet. The network 324 may comprise a data processing network. The one or more network adapters 315 perform communication processing via the network 324.

The internal memory 309 stores an appropriate Operating System 327, and may include one or more drivers 330 (e.g., storage drivers or network drivers). The internal memory 309 may also store one or more application programs 333 and include a section of Random Access Memory (RAM) 336. The Operating System 327 controls transmitting and retrieving packets from remote computing devices (e.g., host computers, storage systems, SCADA, etc.) over the network 324. In some systems and methods, the Supervisory and Data Acquisition Systems and/or Energy Management Systems may connect to the computing system 300 over the network 324. The drivers 330 execute in the internal memory 309 and may include specific commands for the network adapter 315 to communicate over the network 324. Each network adapter 315 or driver 330 may implement logic to process packets, such as a transport protocol layer to process the content of messages included in the packets that are wrapped in a transport layer, such as Transmission Control Protocol (TCP) and/or Internet Protocol (IP).

The storage 312 may comprise an internal storage device or an attached or network accessible storage. Storage 312 may include disk units and tape drives, or other program storage devices that are readable by the system. A removable medium, such as a magnetic disk, an optical disk, a magneto-optical disk, a semiconductor memory, or the like, may be installed on the storage 312, as necessary, so that a computer program read therefrom may be installed into the internal memory 309, as necessary. Programs in the storage 312 may be loaded into the internal memory 309 and executed by the CPU 306. The Operating System 327 can read the instructions on the program storage devices and follow these instructions to execute the methodology herein.

The input/output adapter 318 can connect to peripheral devices, such as input device 339 to provide user input to the CPU 306. The input device 339 may include a keyboard, mouse, pen-stylus, microphone, touch sensitive display screen, or any other suitable user interface mechanism to gather user input. An output device 342 can also be connected to the input/output adapter 318, and is capable of rendering information transferred from the CPU 306, or other component. The output device 342 may include a display monitor (such as a Cathode Ray Tube (CRT), a Liquid Crystal Display (LCD), or the like), printer, speaker, etc.

The computing system 300 may comprise any suitable computing device 303, such as a mainframe, server, personal computer, workstation, laptop, handheld computer, telephony device, network appliance, virtualization device, storage controller, etc. Any suitable CPU 306 and Operating System 327 may be used. Application Programs 333 and data in the internal memory 309 may be swapped into storage 312 as part of memory management operations.

It is expected that any person skilled in the art can implement the disclosed procedure using a computer program. The computer program may include instructions that would be provided to a processor of a general purpose computer, special purpose computer, or other programmable data processing apparatus to produce a machine, such that the instructions that execute via the processor of the computer or other programmable data processing apparatus obtain power flow solutions for a given network model under various realizations of the load, generation, and other parameters.

As will be appreciated by one skilled in the art, aspects of the systems and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read-Only Memory (ROM), an Erasable Programmable Read-Only Memory (EPROM or Flash memory), an optical fiber, a magnetic storage device, a portable compact disc Read-Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The Figures illustrate the architecture, functionality, and operation of possible implementations of systems, methods, and computer program products according to various systems and methods herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular systems and methods only and is not intended to be limiting of this disclosure. As used herein, the singular forms "a", "an", and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The concepts herein have been described with references to specific systems and methods. While particular values, relationships, materials and steps have been set forth for purposes of describing such concepts, it will be appreciated by persons skilled in the art that numerous variations and/or modifications may be made to the systems and methods as shown in the disclosure without departing from the spirit or scope of the basic concepts and operating principles as broadly described. It should be recognized that, in the light of the above teachings, those skilled in the art could modify those specifics without departing from the concepts taught herein. Having now fully set forth certain systems and methods, and modifications of the concepts underlying them, various other systems and methods, as well as potential variations and modifications of the systems and methods shown and described herein, will obviously occur to those skilled in the art upon becoming familiar with such underlying concept. It is intended to include all such modifications and alternatives insofar as they come within the scope of the appended claims or equivalents thereof. It should be understood, therefore, that the concepts disclosed might be practiced otherwise than as specifically set forth herein. Consequently, the present systems and methods are to be considered in all respects as illustrative and not restrictive.

What is claimed is:

1. A computer-implemented method comprising: generating, by a processor, a mathematical model of load flow equations for an electrical grid comprising a radial network having a chain of busses; embedding, by the processor, the mathematical model of the load flow equations in a holomorphic embedding (L(s)) representing the electrical grid, wherein a first embedding parameter s is a variable in a complex domain, and such that by virtue of said holomorphic embedding the value s=0 corresponds to the no-load, no-generation case (L(0)) of said electrical grid, and the value s=1 corresponds to steady state (L(1)) of said electrical grid; transcribing, by the processor, the holomorphic embedding into software for use by the processor adapted to execute the software; calculating, by the processor, voltages for each bus of said chain of busses as an algebraic curve parameterized by the first embedding parameter s; defining, by the processor, a second embedding parameter z as a variable in a complex domain wherein the first embedding parameter s is a function of the second embedding parameter z; generating, by the processor, a re-parameterization of said holomorphic embedding using the second embedding parameter z, such that the re-parameterized embedded equations L(z) provide an elimination polynomial equation relating parameters s and z; determining, by the processor, roots of said elimination polynomial equation solving, by the processor, by using said roots of said elimination polynomial equation to compute bus voltages for each bus of said chain of busses; and displaying, by the processor, the bus voltages for each bus of said chain of busses as the solution to the load flow equations.

2. The computer-implemented method of claim 1, further comprising:
providing, by the processor, a graphical representation of multiple voltage solutions for each bus of said chain of busses as a function of varying load/generation conditions as modified by the holomorphic embedding.

3. The computer-implemented method of claim 1, further comprising:
calculating, by the processor, the roots of the elimination polynomial equation at different values of the first embedding parameter s; and
providing, by the processor, a graphical representation of multiple voltage solutions for each bus of said chain of busses as a function of varying load/generation conditions as modified by the holomorphic embedding.

4. A method comprising:
embedding, by a processor, powerflow equations representing an electrical grid comprising a radial network having a chain of busses in a holomorphic embedding, (L(s)) where s is a first variable in a complex domain that includes a value s=0 corresponding to a no load case (L(0)), in which all voltages are equal to a normal or designed voltage level, and there is no energy flow in links of the electrical grid and the value s=1 corresponding to an objective case (L(1)) representative of the electrical grid in a condition for which stability is to be determined, wherein each variable of the load flow equations (L) is contained in L(s) as a function of the first variable s by said holomorphic embedding;
transcribing, by the processor, the holomorphic embedding into software for use by the processor adapted to execute the software;
calculating, by the processor, voltages for each bus of said chain of busses as an algebraic curve parameterized by said first variable s;
defining, by the processor, a second variable z in the complex domain wherein s is a function of z;
generating, by the processor, a re-parameterization of said holomorphic embedding using the second variable z, such that the re-parameterized embedded equations L(z) provide an elimination polynomial equation relating variables s and z;
determining, by the processor, roots of said elimination polynomial equation;
computing, by the processor, bus voltages for each bus of said chain of busses using said roots of said elimination polynomial equation; and
displaying, by the processor, the bus voltages for each bus of said chain of busses as the solution to the powerflow equations.

5. The method of claim 4, further comprising:
prior to holomorphically embedding the powerflow equations, receiving data from a supervisory and data acquisition system representative of conditions of the electrical grid associated with the powerflow equations.

6. The method of claim 5, further comprising:
forming, by the processor, the powerflow equations from the data received from the supervisory and data acquisition system.

7. The method of claim 4, further comprising:
solving, by the processor, the powerflow equations for the electrical grid using a load flow equation solver.

8. The method of claim 4, further comprising:
providing, by the processor, a graphical representation of multiple voltage solutions for each bus of said chain of busses as a function of varying load/generation conditions as modified by the holomorphic embedding.

9. The method of claim 4, further comprising:
calculating, by the processor, the roots of the elimination polynomial equation at different values of the variable s.

10. A system comprising:
a power generating system having an electrical grid comprising a radial network having a chain of busses;
a supervisory control and data acquisition system adapted to collect data from the electrical grid indicative of electrical conditions in the electrical grid; and
a computer processor adapted to execute software comprising executable computer instructions to:
process data received from the supervisory control and data acquisition system into powerflow equations representing the electrical grid,
embed the powerflow equations representing the electrical grid in a holomorphic embedding using a first parameter s as a variable in a complex domain,
calculate voltages for each bus of said chain of busses as an algebraic curve parameterized by the first parameter s,
define a second parameter z as a variable in the complex domain wherein s is a function of z, re-parameterize said holomorphic embedding using the second parameter z, such that the re-parameterized embedded equations provide an elimination polynomial equation relating parameters s and z, determine roots of said elimination polynomial equation, compute bus voltages for each bus of said chain of busses using said roots of said elimination polynomial equation, and display the bus voltages for each bus of said chain of busses as the solution to the powerflow equations.

11. The system of claim 10, wherein the computer processor further comprises a load flow equation solver solving the powerflow equations.

12. The system of claim 10, wherein the computer processor further includes instructions to calculate the roots of the elimination polynomial equation at different values of the first parameter s.

13. The system of claim 10, wherein the computer processor further includes instructions to display the solution to the powerflow equations further comprises providing a graphical representation of multiple voltage solutions for each bus of said chain of busses as a function of varying load/generation conditions as modified by the holomorphic embedding.

* * * * *